United States Patent
Xiao et al.

(10) Patent No.: US 8,409,962 B2
(45) Date of Patent: Apr. 2, 2013

(54) MANUFACTURING METHOD OF COPPER INTERCONNECTION STRUCTURE WITH MIM CAPACITOR

(75) Inventors: Deyuan Xiao, Shanghai (CN); Xiaolu Huang, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 362 days.

(21) Appl. No.: 12/937,264

(22) PCT Filed: Jul. 14, 2010

(86) PCT No.: PCT/CN2010/075146
§ 371 (c)(1),
(2), (4) Date: Oct. 10, 2010

(87) PCT Pub. No.: WO2011/103735
PCT Pub. Date: Sep. 1, 2011

(65) Prior Publication Data
US 2011/0291235 A1 Dec. 1, 2011

(30) Foreign Application Priority Data
Feb. 25, 2010 (CN) .......................... 2010 1 0114118

(51) Int. Cl.
*H01L 21/20* (2006.01)

(52) U.S. Cl. ........ 438/386; 438/243; 438/622; 438/637; 438/672

(58) Field of Classification Search .......... 438/618–624, 438/637–638, 672–673
See application file for complete search history.

(56) References Cited

U.S. PATENT DOCUMENTS

2005/0164492 A1* 7/2005 Naitoh et al. ................. 438/637

* cited by examiner

*Primary Examiner* — Dung A. Le
(74) *Attorney, Agent, or Firm* — Global IP Services; Tianhua Gu

(57) ABSTRACT present invention discloses a manufacturing method for a copper interconnection structure with MIM capacitor. The method firstly makes a copper conductive pattern in a copper interconnection structure and a copper through hole bolt connected with the copper conductive pattern; etch away an insulation layer around the copper through hole bolt and deposit a etch stop layer, so as to expose the top and side surface of the copper through hole bolt and part of the top surface of the copper conductive pattern; deposit a dielectric layer on the obtained structure and fill a protection material in the recession area of the obtained structure; etch a trench for receiving other copper conductive patterns; remove the protection material; plate copper in the recession area, and plate copper in the trench, so as to obtain a copper interconnection structure with MIM capacitor.

12 Claims, 5 Drawing Sheets

MANUFACTURING METHOD OF COPPER INTERCONNECTION STRUCTURE WITH MIM CAPACITOR

CROSS REFERENCE TO RELATED PATENT APPLICATION

The present application is the US national stage of PCT/CN2010/075146 filed on Jul. 14, 2010, which claims the priority of the Chinese patent application No. 201010114118.9 filed on Feb. 25, 2010, which application is incorporated herein by reference.

BACKGROUND OF THE PRESENT INVENTION

1. Field of Invention

The present invention relates to a metal-insulator-metal (MIM) capacitor and a manufacturing method thereof, more particularly to a structure with MIM capacitor and a manufacturing method thereof adopting copper interconnection technology.

2. Description of Related Arts

With development of the very large scale integrated (VLSI) circuit, the area of capacitor is scaled down according to the Moore担 law. However, in order to assure the performance of capacitor, such as leakage, breakdown voltage, voltage linearization, MIM capacitor is a key element. MIM capacitor is usually of a sandwich structure. The upper metal electrode and lower metal electrode are separated by a thin insulation layer. In conventional MIM capacitor using Aluminum interconnection technology, Al Cu alloy has been used. Currently, Copper has replaced Aluminum becoming a main stream interconnection technology in VSLI. Therefore, MIM capacitor with copper electrode has been widely used.

In copper interconnection technology, a copper dual damascene process is adopted, as shown in FIG. 1, including the following steps of: (1) depositing a thin etch stop layer ($Si_3N_4$); (2) then depositing an insulation layer with a predetermined width on the etch stop layer; (3) then photoetching a via; (4) etching a part of the via; (5) then photoetching a trench; (6) etching the integral via and the trench; (7) then sputtering physical vapor deposition (PVD) diffusion barrier (TaN/Ta) and copper seed layer, wherein Ta is to increase the adhesiveness of Cu, and the seed layer serves as a conductive layer during plating; (8) plating a copper interconnection wire; (9) annealing, chemical mechanical polishing the product, and planarizing and rinsing the copper plating layer. The process of producing an MIM capacitor with copper electrode needs to be compatible with the copper interconnection process.

With increasing of the integration level of the integrate circuit, the capacity of the capacitor needs to be increased within the limited area.

SUMMARY OF THE PRESENT INVENTION

An object of the present invention is to provide a copper interconnection structure with MIM capacitor and a manufacturing method thereof.

In order to accomplish the above object, the present invention provides a method of manufacturing a copper interconnection structure with MIM (metal-insulator-metal) capacitor, comprising steps of:

(a) making a first copper conductive pattern on a first insulation layer;

(b) depositing a first etch stop layer on the first insulation layer, producing a second insulation layer on the first etch stop layer, and making at least one first copper through hole bolt in the second insulation layer connecting with the first copper conductive pattern;

(c) deposit a second etch stop layer on the second insulation layer, and produce a third insulation layer on the second etch stop layer;

(d) etching out the second and third insulation layer and the first and second etch stop layer around the first copper through hole bolt from the third insulation layer to the first copper conductive pattern for exposing a top and side surface of the first copper through hole bolt and part of a top surface of the first copper conductive pattern forming a recession area;

(e) depositing a dielectric layer on top surface of the third insulation layer, an inner surface of the recession area, and an outer surface around the first copper through hole bolt, and filling a protection material in the recession area covered by the dielectric layer;

(f) etching a trench in the third insulation layer from the dielectric layer on the third insulation layer to a bottom of the second etch stop layer for receiving other copper conductive patterns;

(g) removing the protection material;

(h) plating copper in the recession area covered by the dielectric layer forming an upper electrode of an MIM capacitor, and plating copper in the trench formed in step (f) to form the other copper conductive pattern, so as to obtain a copper interconnection structure with MIM capacitor.

Furthermore, in step (b), the method further comprises making second copper through hole bolts in the second insulation layer adjacent to the first copper through hole bolt and connected with the first copper conductive pattern.

Furthermore, in step (b), the method further comprises making third copper through hole bolts in the second insulation layer and connected with the first copper conductive pattern.

The present invention further provides three MIM capacitor structures produced by the above-mentioned methods.

The first MIM capacitor structure produced by the above-mentioned method includes a first copper through hole bolt, and a first copper conductive pattern connected with the first copper through hole bolt serving as a lower electrode.

The second MIM capacitor structure produced by the above-mentioned method includes a first copper through hole bolt, a second copper through hole bolt, and a first copper conductive pattern connected with the first copper through hole bolt and the second copper through hole bolt serving as a lower electrode.

The third MIM capacitor structure produced by the above-mentioned method includes a first copper through hole bolt, a second copper through hole bolt, a third copper through hole bolt, and a first copper conductive pattern connected with the first copper through hole bolt, the second copper through hole bolt, and the third copper through hole bolt serving as a lower electrode.

The present invention further provides a copper interconnection structure with MIM (metal-insulator-metal) capacitor produced by the above-mentioned method.

The advantages of the copper interconnection structure with MIM (metal-insulator-metal) capacitor and the manufacturing method thereof are listed as below. The method is compatible with the copper interconnection process. The capacity of the capacitor is increased within the limited electrode area. The process is simplified and the cost can be saved.

DETAILED DESCRIPTION OF THE PREFERRED EMBODIMENT

Figure 1:
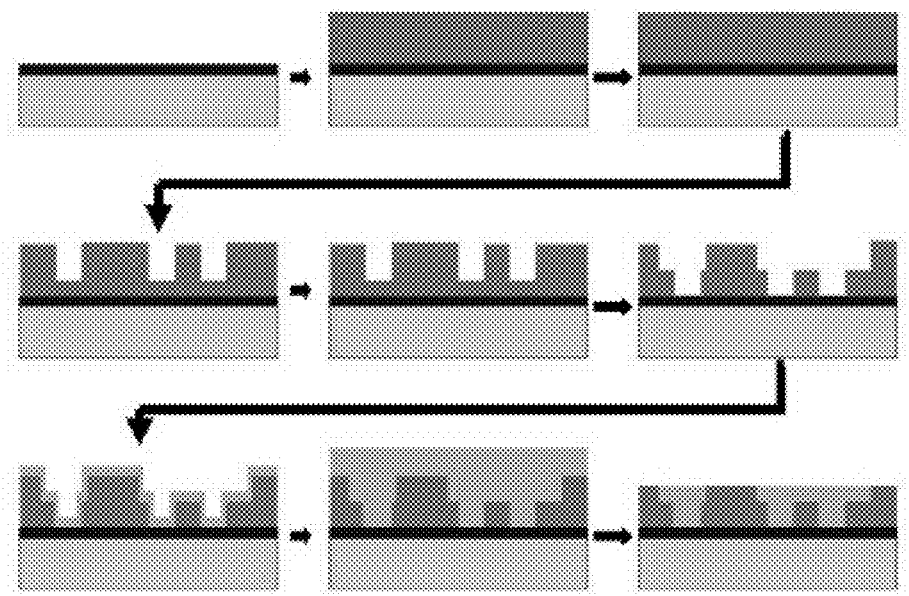
FIG. 1 is a schematic view of a copper dual damascene process of prior art.

The present invention is further explained in detail according to the accompanying drawings. It should be noted that figures are schematic representations of devices, and not drawn to scale.

EXAMPLE I

Please referring to FIG. 2 through FIG. 7, a method of manufacturing a structure with metal-insulator-metal (MIM) capacitor comprises the following steps.

(a) Produce a first copper conductive pattern 400 on a first insulation layer 101 by applying dual damascene process, and prepare a diffusion barrier layer 300 between the first copper conductive pattern 400 and the first insulation layer 101 to separate the first copper conductive pattern 400 and the first insulation layer 101.

(b) Deposit a first etch stop layer 201 on the first insulation layer 101, produce a second insulation layer 102 on the first etch stop layer 201, produce at least one first copper through hole bolt 401 on the second insulation layer 102 by applying dual damascene process to connect with the first copper conductive pattern 400, and deposit a diffusion barrier layer 300 on a side and bottom surfaces of the first copper through hole bolt 401.

(c) deposit a second etch stop layer 202 on the second insulation layer 102, and produce a third insulation layer 103 on the second etch stop layer 202.

Figure 2:
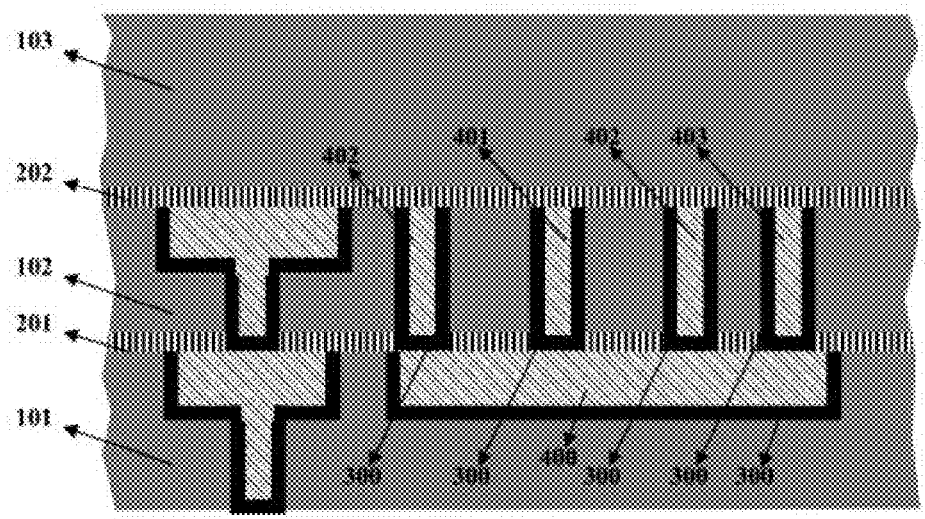
FIG. 2 is a cross sectional view of a copper interconnection structure with MIM capacitor after step (a) (b) and (c) according to a preferred embodiment of the present invention.

After steps (a), (b) and (c), a structure as shown in FIG. 2 is formed. The first, second and third insulation layer 101, 102 and 103 adopt low k (dielectric constant) dielectric material, the first and second etch stop layer 201 and 202 adopts silicon nitride material, and the diffusion barrier layer 300 adopts material selected from a group consisting of Ta, TaN, and TaSiN.

Figure 3:
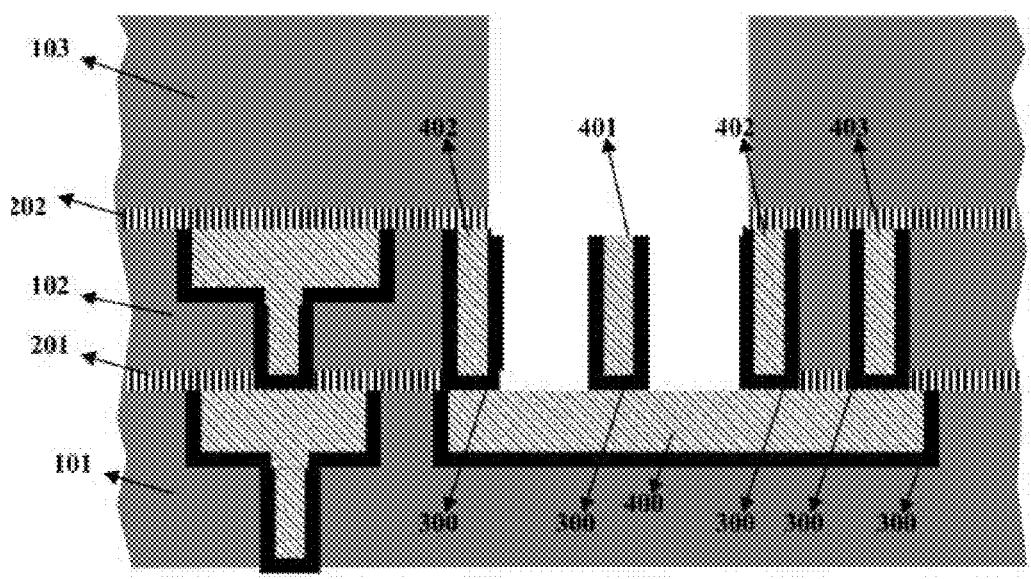
FIG. 3 is a cross sectional view of a copper interconnection structure with MIM capacitor after step (d) according to the above preferred embodiment of the present invention.

(d) As shown in FIG. 3, etch out the second and third insulation layer 102 and 103 and the first and second etch stop layer 201 and 202 around the first copper through hole bolt 401 from the third insulation layer 103 to the first copper conductive pattern 400 via a selective dry etching method to expose the top and side surface of the first copper through hole bolt 401 and part of the top surface of the first copper conductive pattern 400 forming a recession area, wherein the diffusion barrier layer 300 remains on side of the first copper through hole bolt 401.

Figure 4:
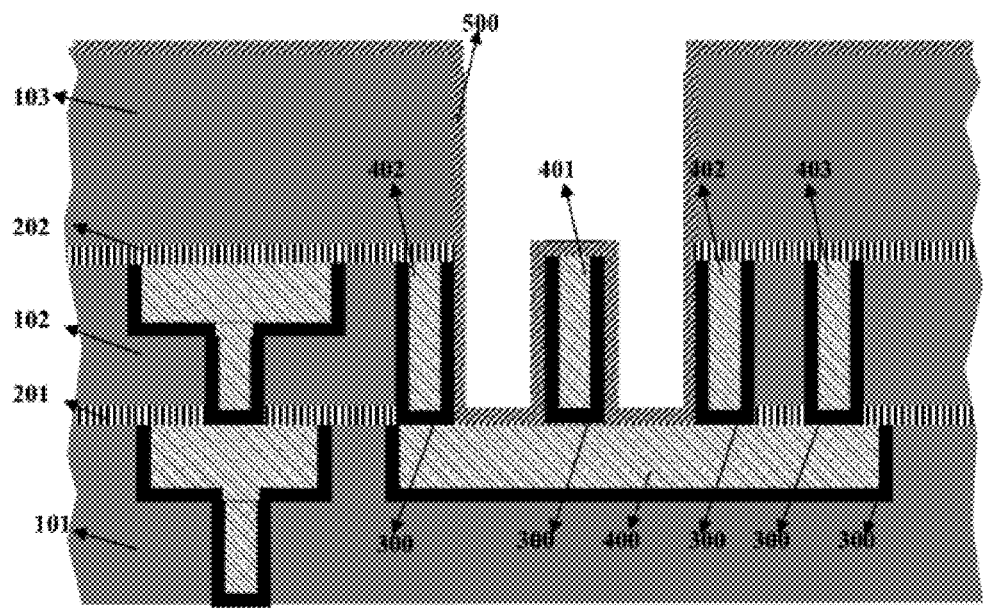
FIG. 4 is a cross sectional view of a copper interconnection structure with MIM capacitor after a dielectric layer is formed in step (d) according to the above preferred embodiment of the present invention.
Figure 5:
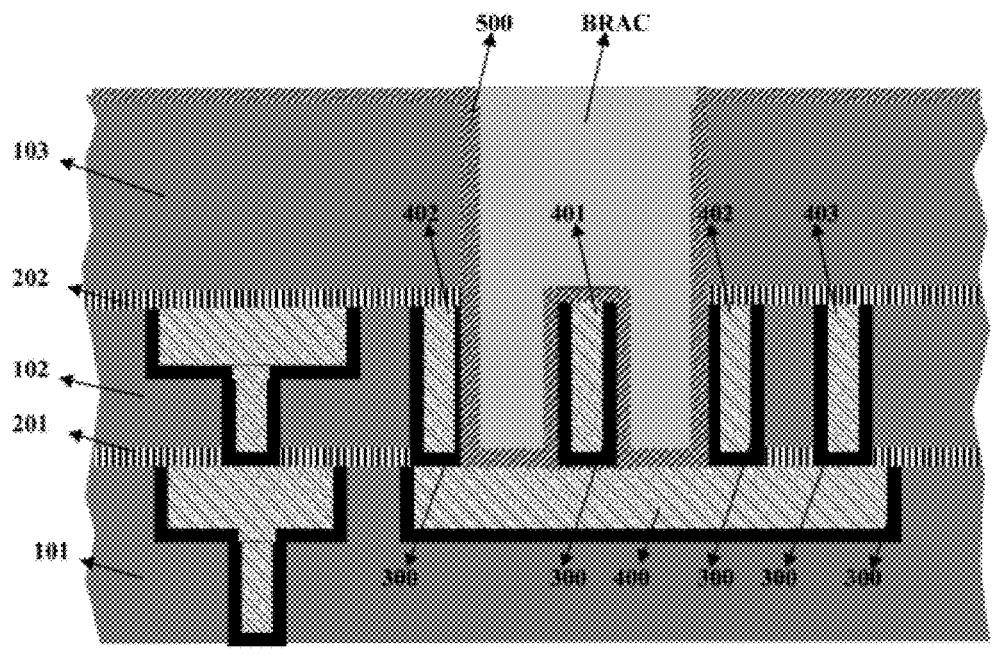
FIG. 5 is a cross sectional view of a copper interconnection structure with MIM capacitor after step (e) according to the above preferred embodiment of the present invention.

(e) As shown in FIG. 4, deposit a dielectric layer 500 on top surface of the third insulation layer, an inner surface of the recession area, and an outer surface around the first copper through hole bolt 401, wherein the dielectric layer 500 adopts a material selected from a group consisting of silicon nitride, tantalum oxide, titanium oxide and aluminum oxide, wherein in the preferred embodiment, silicon nitride is preferred, and the thickness of the dielectric layer 500 is preferably ranging from 15 to 150 nm. Then as shown in FIG. 5, fill protection material in the recession area covered by the dielectric layer 500 so as to protect the dielectric layer 500 from being contaminated by etching process. The protection material is BARC (Bottom Anti-reflection Coating) material. BARC is common material used by one skilled in the art and is available in the market. The BARC material can be used as photoresist that can be patterned via lithography and can serve as etch mask by utilizing the patterned prepared via lithography.

Figure 6:
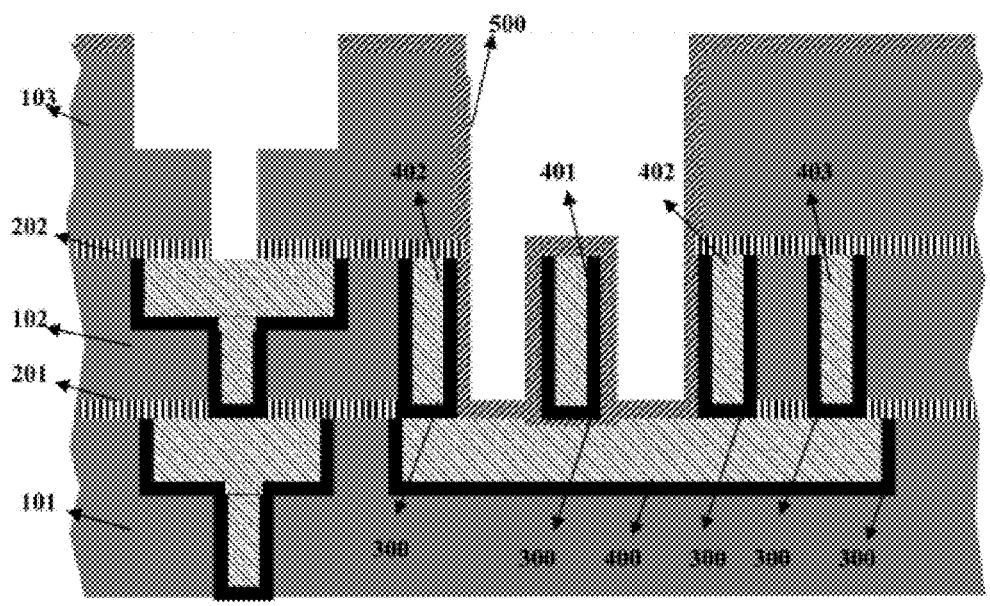
FIG. 6 is a cross sectional view of a copper interconnection structure with MIM capacitor after step (f) and (g) according to the above preferred embodiment of the present invention.

(f) As shown in FIG. 6, etch a trench or through hole in the third insulation layer 103 from the dielectric layer 500 on the third insulation layer 103 to the bottom of the second etch stop layer via a selective dry etching method for receiving other copper conductive pattern 700, wherein the trench has an upper portion and a lower portion extending downwardly from a center of bottom of the upper portion and narrower than the upper portion.

(g) As shown in FIG. 6, remove BARC protection material via plasma.

Figure 7:
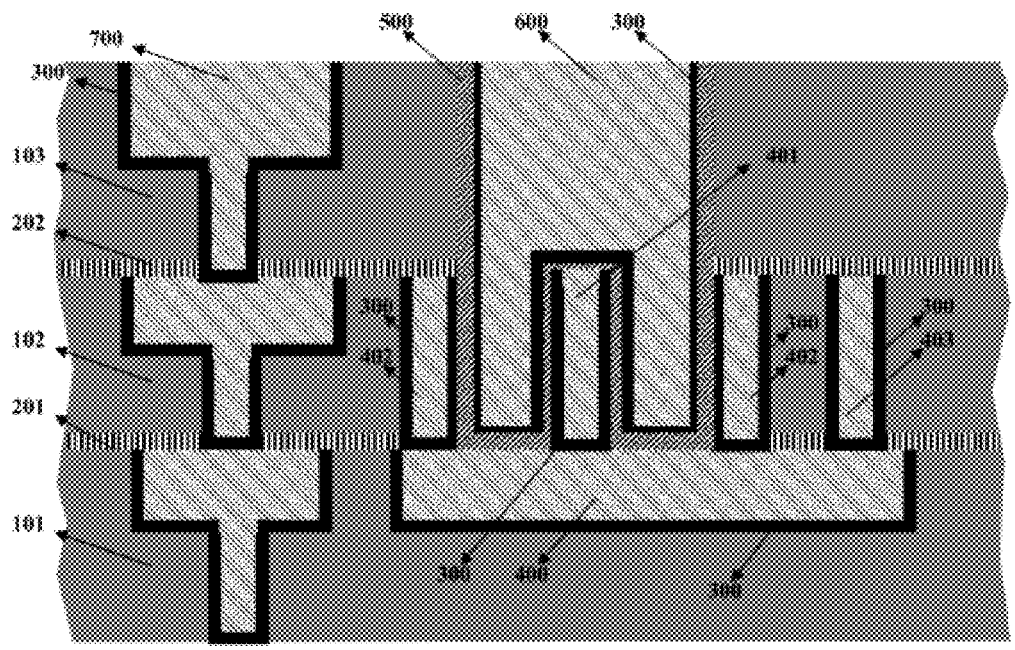
FIG. 7 is a cross sectional view of a completed copper interconnection structure with MIM capacitor according to the above preferred embodiment of the present invention.

(h) As shown in FIG. 7, after step (g), plate copper in the recession area covered by the dielectric layer 500 forming an upper electrode 600 of an MIM capacitor, and plate copper in the trench formed in step (f) to form the other copper conductive pattern 700. The copper dual damascene process is adopted for producing the upper electrode 600. Firstly, deposit a diffusion barrier layer 300, form a copper seed layer, and plate copper via electrochemical plating (ECP). The diffusion barrier layer 300 is used to separate the upper electrode 600 of the MIM capacitor and the dielectric layer 500. All the copper conductive patterns 700 adopt copper dual 耀 dprocess and are separated by a diffusion barrier layer 300. Finally, chemical mechanical polish the surface of the product, and planarize and rinse the copper plating layer, so that a copper interconnection structure with MIM capacitor is obtained.

Figure 8:
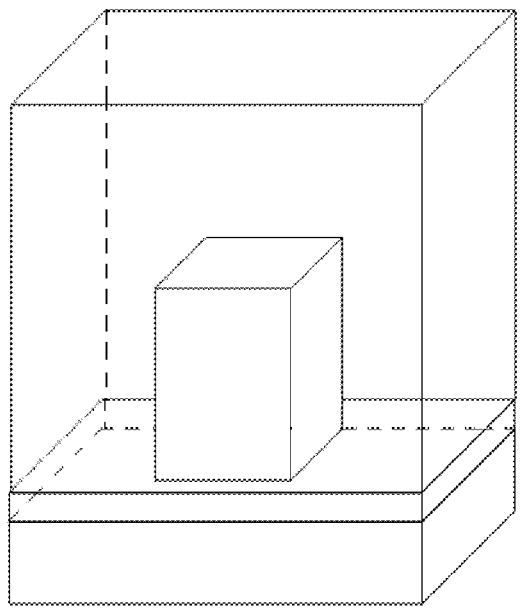
FIG. 8 is a perspective view of a copper interconnection structure with MIM capacitor including a first copper through hole bolt of prism shape.
Figure 9:
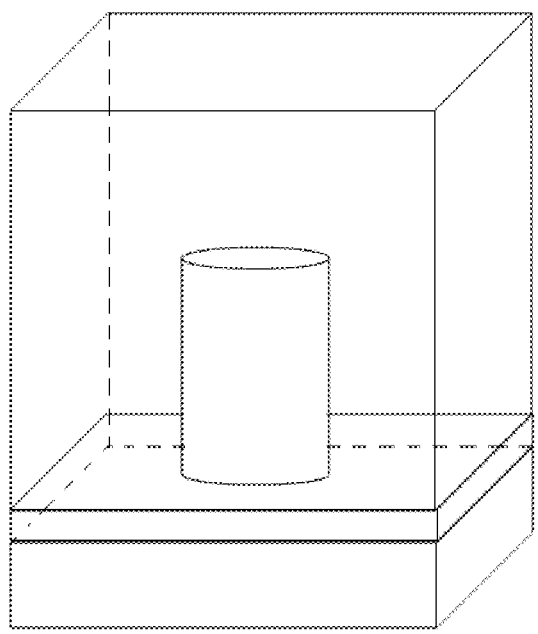
FIG. 9 is a perspective view of a copper interconnection structure with MIM capacitor including a first copper through hole bolt of cylindrical shape.

When making MIM capacitor in the copper interconnection layer, other copper interconnection conductive pattern can be accomplished, so that the IC manufacturing process is simplified and the cost is saved. The first copper through hole bolt 401 and the first copper conductive pattern 400 connected with the first copper through hole bolt 401 serve as lower electrode of the MIM capacitor. As shown in FIG. 8 and FIG. 9, the first copper through hole bolt is prism or cylindrical shape.

EXAMPLE II

Preferably, in step (b), the present invention further comprises making second copper through hole bolts 402 in the second insulation layer 102 adjacent to the first copper through hole bolt 401 and connected with the first copper conductive pattern 400, as shown in FIG. 2.

The side and bottom surface of the second copper through hole bolt 402 produced by the copper dual damascene process are covered by a diffusion barrier layer 300. The side surface of the second copper through hole bolt 402 including the diffusion barrier layer that is adjacent to the first copper through hole bolt 401 is exposed after step (d), and then a copper interconnection structure with MIM capacitor is obtained according to the method disclosed in example I.

In this example, the first copper through hole bolt 401 and the second copper through hole bolt 402 and the first copper conductive pattern 400 that connects to the first copper through hole bolt 401 and the second copper through hole bolt 402 serve as the lower electrode. The part of side surface of the second copper through hole bolt 402 connects with the dielectric layer 500 to increase the capacity area so as to increase the capacity of the MIM capacitor.

EXAMPLE III

Preferably, in step (b), the present invention further comprises making third copper through hole bolts 403 in the second insulation layer 102 by the copper dual damascene process, and connecting the third copper through hole bolt 403 with the first copper conductive pattern 400. A diffusion barrier layer 300 is prepared between the third copper through hole bolt 403 and the second insulation layer 102, as shown in FIG. 2. Then a copper interconnection structure with MIM capacitor is obtained according to the method disclosed in example II.

In this example, the first copper through hole bolt 401, the second copper through hole bolt 402, the third copper through hole bolt 403 and the first copper conductive pattern 400 that connects to the first copper through hole bolt 401, the second copper through hole bolt 402 and the third copper through hole bolt 403 serve as the lower electrode. The third copper through hole bolt 403 serves as the extraction electrode ii of the lower electrode of the MIM capacitor.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A method of manufacturing a copper interconnection structure with MIM (metal-insulator-metal) capacitor, comprising steps of:
   (a) making a first copper conductive pattern on a first insulation layer;
   (b) depositing a first etch stop layer on the first insulation layer, producing a second insulation layer on the first etch stop layer, and making at least one first copper through hole bolt in the second insulation layer connecting with the first copper conductive pattern;
   (c) deposit a second etch stop layer on the second insulation layer, and produce a third insulation layer on the second etch stop layer;
   (d) etching out the second and third insulation layer and the first and second etch stop layer around the first copper through hole bolt from the third insulation layer to the first copper conductive pattern for exposing a top and side surface of the first copper through hole bolt and part of a top surface of the first copper conductive pattern forming a recession area;
   (e) depositing a dielectric layer on top surface of the third insulation layer, an inner surface of the recession area, and an outer surface around the first copper through hole bolt, and filling a protection material which is BARC (Bottom Anti-reflection Coating) material in the recession area covered by the dielectric layer;
   (f) etching a trench in the third insulation layer from the dielectric layer on the third insulation layer to a bottom of the second etch stop layer for receiving other copper conductive patterns;
   (g) removing the protection material;
   (h) plating copper in the recession area covered by the dielectric layer forming an upper electrode of an MIM capacitor, and plating copper in the trench formed in step (f) to form the other copper conductive pattern, so as to obtain a copper interconnection structure with MIM capacitor.

2. The method of manufacturing a copper interconnection structure with MIM capacitor, as recited in claim 1, further comprising a step of chemical mechanical polishing the obtained copper interconnection structure with MIM capacitor.

3. The method of manufacturing a copper interconnection structure with MIM capacitor, as recited in claim 1, wherein in step (a), a copper dual damascene process is adopted to produce the first copper conductive layer, and a diffusion barrier layer is prepared between the first copper conductive pattern and the first insulation layer to separate the first copper conductive pattern and the first insulation layer.

4. The method of manufacturing a copper interconnection structure with MIM capacitor, as recited in claim 1, wherein in step (b), a copper dual damascene process is adopted to produce the first copper through hole bolt, and a diffusion barrier layer is prepared at a side and bottom surface of the first copper through hole bolt.

5. The method of manufacturing a copper interconnection structure with MIM capacitor, as recited in claim 1, wherein the dielectric layer adopts a material selected from a group consisting of silicon nitride, tantalum oxide, titanium oxide and aluminum oxide.

6. The method of manufacturing a copper interconnection structure with MIM capacitor, as recited in claim 1, wherein in step (h), before the upper electrode is produced, deposit a diffusion barrier layer, form a copper seed layer, and plate copper via electrochemical plating (ECP) to produce the upper electrode.

7. The method of manufacturing a copper interconnection structure with MIM capacitor, as recited in claim 1, wherein other copper conductive pattern is produced via copper dual damascene process, and a diffusion barrier layer is prepared at a side and bottom surface of the other copper conductive pattern.

8. The method of manufacturing a copper interconnection structure with MIM capacitor, as recited in claim 1, wherein in step (b), the method further comprises making second copper through hole bolts in the second insulation layer adjacent to the first copper through hole bolt and connected with the first copper conductive pattern.

9. The method of manufacturing a copper interconnection structure with MIM capacitor, as recited in claim 8, wherein the side surface of the second copper through hole bolt adjacent to the first copper through hole bolt is exposed after step (d).

10. The method of manufacturing a copper interconnection structure with MIM capacitor, as recited in claim 8, wherein the second copper through hole bolt is produced via copper dual damascene process, and a side and bottom surface of the second copper through hole bolt are covered by a diffusion barrier layer.

11. The method of manufacturing a copper interconnection structure with MIM capacitor, as recited in claim 1, wherein in step (b), the method further comprises making third copper through hole bolts in the second insulation layer and connected with the first copper conductive pattern.

12. The method of manufacturing a copper interconnection structure with MIM capacitor, as recited in claim 11, wherein the third copper through hole bolt is produced via copper dual damascene process, and a side and bottom surface of the third copper through hole bolt are covered by a diffusion barrier layer.

* * * * *